United States Patent
Flynn et al.

(10) Patent No.: US 9,611,399 B2
(45) Date of Patent: Apr. 4, 2017

(54) FLUORINATED COATINGS WITH LUBRICIOUS ADDITIVE

(71) Applicant: 3M INNOVATIVE PROPERTIES COMPANY, St. Paul., MN (US)

(72) Inventors: Richard M. Flynn, Mahtomedi, MN (US); Erik D. Olson, Shakopee, MN (US); Kevin J. Bechtold, St. Paul, MN (US); Michael W. Bench, Eagan, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 229 days.

(21) Appl. No.: 14/350,776

(22) PCT Filed: Nov. 2, 2012

(86) PCT No.: PCT/US2012/063182
§ 371 (c)(1),
(2) Date: Apr. 9, 2014

(87) PCT Pub. No.: WO2013/074299
PCT Pub. Date: May 23, 2013

(65) Prior Publication Data
US 2014/0287248 A1 Sep. 25, 2014

Related U.S. Application Data

(60) Provisional application No. 61/559,762, filed on Nov. 15, 2011.

(51) Int. Cl.
| | |
|---|---|
| *C09D 183/08* | (2006.01) |
| *C09D 7/12* | (2006.01) |
| *C09D 183/12* | (2006.01) |
| *C23C 16/56* | (2006.01) |
| *B32B 27/28* | (2006.01) |
| *C08G 77/18* | (2006.01) |
| *C08G 77/24* | (2006.01) |
| *C08G 77/46* | (2006.01) |

(52) U.S. Cl.
CPC ........... *C09D 7/125* (2013.01); *C09D 183/08* (2013.01); *C09D 183/12* (2013.01); *C23C 16/56* (2013.01); *B32B 27/283* (2013.01); *C08G 77/18* (2013.01); *C08G 77/24* (2013.01); *C08G 77/46* (2013.01); *Y02P 20/582* (2015.11); *Y10T 428/31663* (2015.04)

(58) Field of Classification Search
CPC .................................................. B32B 27/283
USPC ........... 106/287.13, 287.14, 287.15; 428/447
See application file for complete search history.

(56) References Cited

U.S. PATENT DOCUMENTS

| | | | |
|---|---|---|---|
| 3,250,808 A | 5/1966 | Moore | |
| 6,846,568 B2* | 1/2005 | Yamaya | C08J 7/045 428/336 |
| 7,294,731 B1 | 11/2007 | Flynn | |
| 7,709,549 B2* | 5/2010 | Yoshikawa | C08L 83/08 428/412 |
| 8,101,682 B2 | 1/2012 | Standke | |
| 8,142,896 B2* | 3/2012 | Biteau | C09D 183/08 428/447 |
| 8,476,385 B2 | 7/2013 | Dams et al. | |
| 2006/0014895 A1 | 1/2006 | Shiono | |
| 2008/0050600 A1* | 2/2008 | Fan | C07F 7/1836 428/447 |
| 2009/0208728 A1 | 8/2009 | Itami | |
| 2015/0159022 A1* | 6/2015 | Bradford | C09D 4/00 106/287.14 |
| 2015/0275046 A1* | 10/2015 | Yamane | C03C 17/30 428/429 |
| 2015/0307719 A1* | 10/2015 | Mitsuhashi | C09D 5/16 428/447 |

FOREIGN PATENT DOCUMENTS

| | | |
|---|---|---|
| EP | 1373014 | 1/2004 |
| EP | 1614718 | 1/2006 |
| WO | WO 99/37720 A1 | 7/1999 |
| WO | WO 2012-064646 | 5/2012 |

OTHER PUBLICATIONS

Kostjuk, "Anionic Ring-Opening Polymerization of Hexafluoropropylene Oxide Using Alkali Metal Fluorides as Catalysts: A Mechanistic Study", Macromolecules, 2009, vol. 42, pp. 612-619.
International Search Report for PCT International Application No. PCT/US2012/063182, mailed on Jan. 30, 2013, 3 pages.

* cited by examiner

*Primary Examiner* — Marc Zimmer
(74) *Attorney, Agent, or Firm* — Bradford B. Wright

(57) ABSTRACT

Fluorinated coatings having a lubricious additive, articles with the fluorinated coatings, and methods of making articles with the fluorinated coatings are provided. More specifically, the fluorinated coatings are prepared from a curable coating composition that includes both a fluorinated silane and a fluorinated polyether oil. The curable coating composition is typically applied adjacent to a siliceous substrate and then cured. The resulting cured articles can have an outer surface that has a good tactile response, that is abrasion resistant, that is easy to clean, or a combination thereof.

18 Claims, No Drawings

FLUORINATED COATINGS WITH LUBRICIOUS ADDITIVE

CROSS REFERENCE TO RELATED APPLICATION

This application claims the benefit of U.S. Provisional Patent Application No. 61/559,762, filed Nov. 15, 2011, the disclosure of which is incorporated by reference herein in its entirety.

FIELD

Fluorinated coatings having a lubricious additive, articles with the fluorinated coatings, and methods of making articles with the fluorinated coatings are provided.

BACKGROUND

Various compositions of fluorochemical materials have been applied to surfaces to impart low surface energy characteristics such as oil and/or water repellency (oleophobicity and/or hydrophobicity). Some of these fluorochemical materials are fluorinated silanes. Various fluorinated silanes are described, for example, in U.S. Pat. No. 7,294,731 B1 (Flynn et al.), U.S. Patent Application Publication 2006/0014895 (Shiono), U.S. Patent Application Publication 2009/0208728 (Itami et al.), and U.S. Pat. No. 3,250,808 (Moore et al.).

SUMMARY

Fluorinated coatings having a lubricious additive, articles with the fluorinated coatings, and methods of making articles with the fluorinated coatings are provided. More specifically, the fluorinated coatings are prepared from a curable coating composition that includes both a fluorinated silane and a fluorinated polyether oil. The curable coating composition is typically applied adjacent to a siliceous substrate and then cured. The resulting cured articles can have an outer surface that has a good tactile response, that is abrasion resistant, that is easy to clean, or a combination thereof.

In a first aspect, a curable coating composition is provided that includes 1) a fluorinated silane and 2) a fluorinated polyether oil having zero or one hydrogen atom per molecule. The fluorinated silane is of Formula (I).

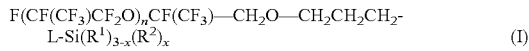
(I)

In Formula (I), L is a single bond or —S—CH$_2$CH$_2$CH$_2$—. Group R$^1$ is hydroxy or a hydrolyzable group. Group R$^2$ is a non-hydrolyzable group. The variable n is an integer in a range of 4 to 100. The variable x is equal to 0, 1, or 2.

In a second aspect, an article is provided that contains a) a siliceous substrate and b) a layer of a curable coating composition adjacent to the siliceous substrate. The curable coating composition includes 1) a fluorinated silane and 2) a fluorinated polyether oil having zero or one hydrogen atom per molecule. The fluorinated silane is of Formula (I).

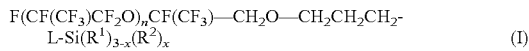
(I)

In Formula (I), L is a single bond or —S—CH$_2$CH$_2$CH$_2$—. Group R$^1$ is hydroxy or a hydrolyzable group. Group R$^2$ is a non-hydrolyzable group. The variable n is an integer in a range of 4 to 100. The variable x is equal to 0, 1, or 2.

In a third aspect, an article is provided that contains a) a siliceous substrate and b) a layer of a cured coating composition adjacent to the siliceous substrate. The cured coating composition includes a reaction product of a curable coating composition with a surface of the siliceous substrate. The curable coating composition includes 1) a fluorinated silane and 2) a fluorinated polyether oil having zero or one hydrogen atom per molecule. The fluorinated silane is of Formula (1).

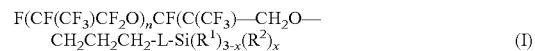
(I)

In Formula (I), L is a single bond or —S—CH$_2$CH$_2$CH$_2$—. Group R$^1$ is hydroxy or a hydrolyzable group. Group R$^2$ is a non-hydrolyzable group. The variable n is an integer in a range of 4 to 100. The variable x is equal to 0, 1, or 2.

In a fourth aspect, a method of making a fluorinated surface is provided. The method includes providing a siliceous substrate and disposing a curable coating composition adjacent to the siliceous substrate. The curable coating composition includes 1) a fluorinated silane and 2) a fluorinated polyether oil having zero or one hydrogen atom per molecule. The fluorinated silane is of Formula (I).

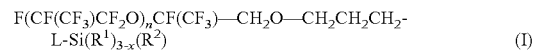
(I)

In Formula (I), L is a single bond or —S—CH$_2$CH$_2$CH$_2$—. Group R$^1$ is hydroxy or a hydrolyzable group. Group R$^2$ is a non-hydrolyzable group. The variable n is an integer in a range of 4 to 100. The variable x is equal to 0, 1, or 2. The method further includes reacting the curable coating composition with a surface of the siliceous substrate to form a cured coating composition.

DETAILED DESCRIPTION

Curable coating compositions are provided that include both a fluorinated silane and a fluorinated polyether oil. The curable coating compositions can be applied to a siliceous substrate. The fluorinated silane has a silyl group that can react with a surface of the siliceous substrate forming a —Si—O—Si— bond. The resulting article can be used to provide a surface with abrasion resistance, with easy to clean characteristics, with a good tactile response (i.e., a finger can easily slide over the surface), or a combination thereof.

The recitation of any numerical range by endpoints is meant to include the endpoints of the range, all numbers within the range, and any narrower range within the stated range.

The term "a", "an", and "the" are used interchangeably with "at least one" to mean one or more of the elements being described.

The term "and/or" means either or both. For example, the expression "A and/or B" means A, B, or a combination of A and B.

The term "fluorinated" refers to a group or compound that contains at least one fluorine atom attached to a carbon atom.

The term "perfluorinated" refers to a group or compound having all C—H bonds replaced with C—F bonds. Examples include perfluoropolyether groups or compounds, perfluoroether groups or compounds, and perfluoroalkane groups or compounds. Perfluorinated groups or compounds are a subset of fluorinated groups or compounds.

The term "ether" refers to a group or compound having an oxy group between two carbon atoms. Ether groups are often divalent groups such as —CH$_2$—O—CH$_2$— or —CF$_2$—O—CF$_2$—.

The term "polyether" refers to a group or compound having multiple ether groups.

The term "thioether" refers to a group or compound having a thio group between two carbon atoms. Thioether groups are the divalent group —$CH_2$—S—$CH_2$—.

The curable coating compositions include both a fluorinated silane and a fluorinated polyether. The fluorinated silane is of Formula (I).

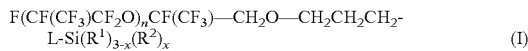

(I)

In Formula (I), L is a single bond or —S—$CH_2CH_2CH_2$—. Group $R^1$ is hydroxy or a hydrolyzable group. Group $R^2$ is a non-hydrolyzable group. The variable x is equal to 0, 1, or 2. The variable n is an integer in a range of 4 to 100, in a range of 5 to 100, in a range of 10 to 100, in a range of 10 to 80, in a range of 10 to 60, in a range of 10 to 50, in a range of 10 to 40, in a range of 20 to 100, in a range of 40 to 100, in a range of 50 to 100, or in a range of 60 to 100.

In some fluorinated silanes, the group L is a single bond and the fluorinated silane of Formula (I) is of Formula (IA).

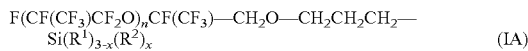

(IA)

In other fluorinated silanes, the group L is —S—$CH_2CH_2CH_2$— and the fluorinated silane of Formula (I) is of Formula (IB).

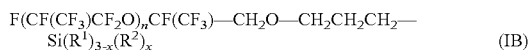

(IB)

The fluorinated silane has a perfluoropolyether group of formula F($CF(CF_3)CF_2O)_n CF(CF_3)$—. The perfluoropolyether group has multiple branched hexafluoropropylene oxide —($CF(CF_3)CF_2O$)— groups. The number average molecular weight of the perfluoropolyether group of the fluorinated silane is at least 750 grams/mole, at least 800 grams/mole, at least 900 grams/mole, or at least 1000 grams/mole. In some embodiments, higher number average molecular weights can further enhance durability. The higher weight fluorinated silanes can, for example, protect surfaces from moisture and hydrolysis. Generally, for ease of use and application, the number average molecular weight of the perfluoropolyether group is often up to 15,000 grams/mole, up to 12,000 grams/mole, up to 10,000 grams/mole, up to 7,500 grams/mole, up to 6000 grams/mole, up to 5000 grams/mole, up to 4000 grams/mole, or up to 3000 grams/mole. In some embodiments, the number average molecular weight is in a range of 1000 to 15,000 grams/mole, in a range of 1000 to 10,000 grams/mole, in a range of 1000 to 6000 grams/mole, in a range of 2000 to 10,000 grams/mole, in a range of 2000 to 6000 grams/mole, in a range of 3000 to 10,000 grams/mole, or in a range of 3000 to 6000 grams/mole.

The fluorinated silane of Formula (I) has a silyl group —Si($R^1$)$_{3-x}$(R)$_x$ where each $R^1$ group is selected from a hydroxyl or a hydrolyzable group and each $R^2$ group is selected from a non-hydrolyzable group. There is at least one $R^1$ group. That is, there can be one $R^1$ group and two $R^2$ groups, two $R^1$ groups and one $R^2$ group, or three $R^1$ groups and no $R^2$ group. When there are multiple $R^1$ groups, they can be the same or different. Likewise, when there are multiple $R^2$ groups, they can be the same or different. In many embodiments, there are three identical $R^1$ groups.

The term "hydrolyzable group" refers to a group that can react with water having a pH of 1 to 10 under conditions of atmospheric pressure. The hydrolyzable group is usually converted to a hydroxyl group when it reacts. The hydroxyl group often undergoes further reactions such as with a siliceous substrate. Typical hydrolyzable groups include alkoxy, aryloxy, aralkyloxy, acyloxy, and halo groups.

Suitable alkoxy $R^1$ groups are of formula —$OR^a$ where $R^a$ is an alkyl group having 1 to 10 carbon atoms, 1 to 6 carbon atoms, 1 to 4 carbon atoms, 1 to 3 carbon atoms, or 1 to 2 carbon atoms. The alkyl portion of the alkoxy group can be linear, branched, cyclic, or a combination thereof. In many embodiments of Formula (I), each $R^1$ group is an alkoxy having 1 to 4 carbon atoms or 1 to 3 carbon atoms.

Suitable aryloxy $R^1$ groups are of formula —OAr where Ar is an aryl group. The aryl group is monovalent group having at least one carbocyclic aromatic ring. Additional carbocyclic rings can be fused to the aromatic ring. Any additional rings can be unsaturated, partially saturated, or saturated. The aryl portion of the aryloxy group often has 6 to 12 carbon atoms or 6 to 10 carbon atoms. In many embodiments, the aryloxy group is phenoxy.

Suitable aralkyloxy $R^1$ groups are of formula —$OR^b$—Ar. The group $R^b$ is a divalent alkylene group (i.e., divalent radical of an alkane), having 1 to 10 carbon atoms, 1 to 6 carbon atoms, or 1 to 4 carbon atoms. The alkylene can be linear, branched, cyclic, or a combination thereof. The group Ar is an aryl group having at least one carbocyclic aromatic ring. Additional carbocyclic rings can be fused to the aromatic ring. Any additional rings can be unsaturated, partially saturated, or saturated. The aryl group often has 6 to 12 carbon atoms or 6 to 10 carbon atoms. The aryl group is often phenyl.

Suitable acyloxy $R^1$ groups are of formula —O(CO)$R^c$ where $R^c$ is alkyl, aryl, or aralkyl. The group (CO) denotes a carbonyl group. Suitable alkyl $R^c$ groups often have 1 to 10 carbon atoms, 1 to 6 carbon atoms, or 1 to 4 carbon atoms. The alkyl can be linear, branched, cyclic, or a combination thereof. Suitable aryl $R^c$ groups are carbocyclic and have at least one aromatic ring. Additional carbocyclic rings can be fused to the aromatic ring. Any additional rings can be unsaturated, partially saturated, or saturated. The aryl group usually has 6 to 12 carbon atoms or 6 to 10 carbon atoms. The aryl group is often phenyl. Suitable aralkyl $R^c$ groups often have an alkylene group with 1 to 10 carbon atoms, 1 to 6 carbon atoms, or 1 to 4 carbon atoms and an aryl group with 6 to 12 carbon atoms, or 6 to 10 carbon atoms. The alkylene portion of the aralkyl group can be linear, branched, cyclic, or a combination thereof. The aryl portion of the aralkyl group has at least one carbocyclic aromatic ring. Additional carbocyclic rings can be fused to the aromatic ring. Any additional rings can be unsaturated, partially saturated, or saturated. The aryl group often has 6 to 12 carbon atoms or 6 to 10 carbon atoms. The aryl portion of the aralkyl group is often phenyl.

Suitable halo $R^1$ groups can be bromo, iodo, or chloro groups. The halo is often chloro.

Each $R^2$ group in Formulas (1) is a non-hydrolyzable group. The term "non-hydrolyzable group" refers to a group that does not react with water having a pH of 1 to 10 under conditions of atmospheric pressure. In many embodiments, the non-hydrolyzable group is an alkyl, aryl, or aralkyl group. Suitable alkyl $R^2$ groups include those having 1 to 10 carbon atoms, 1 to 6 carbon atoms, or 1 to 4 carbon atoms. The alkyl can be linear, branched, cyclic, or a combination thereof. Suitable aryl $R^2$ groups are carbocyclic and have at least one aromatic ring. Additional carbocyclic rings can be fused to the aromatic ring. Any additional rings can be unsaturated, partially saturated, or saturated. The aryl group often has 6 to 12 carbon atoms or 6 to 10 carbon atoms. The aryl group is often phenyl. Suitable aralkyl $R^2$ groups often have an alkylene group having 1 to 10 carbon atoms, 1 to 6 carbon atoms, or 1 to 4 carbon atoms and an aryl group with 6 to 12 carbon atoms, or 6 to 10 carbon atoms. The alkylene portion of the aralkyl group can be linear, branched, cyclic, or a combination thereof. The aryl portion of the aralkyl group has at least one carbocyclic aromatic ring. Additional carbocyclic rings can be fused to the aromatic ring. Any additional rings can be unsaturated, partially saturated, or saturated. The aryl group often has 6 to 12 carbon atoms or 6 to 10 carbon atoms. The aryl portion of the aralkyl group is often phenyl.

Methods of preparing the compounds of Formulas (IA) are known. These fluorinated silanes can be prepared by initially preparing a fluorinated methyl ester of Formula (II) where n is the same as defined for Formula (I).

$$F(CF(CF_3)CF_2O)_nCF(CF_3)-(CO)OCH_3 \quad (II)$$

This fluorinated methyl ester of Formula (II) can be prepared by several methods. In a first method, the fluorinated methyl ester is prepared by metal fluoride-initiated oligomerization of hexafluoropropylene oxide in diglyme (i.e. bis(2-methoxyethyl) ether) solvent according to the method described in U.S. Pat. No. 3,250,808 (Moore et al.), the description of which is incorporated herein by reference. The fluorinated methyl ester can be purified by distillation to remove low-boiling components. Other solvents can also be used in addition to those described in Moore et al. including hexafluoropropene, 1,1,1,3,3-pentafluorobutane and 1,3-bis(trifluoromethyl)benzene as described by S. V. Kostjuk et al. in *Macromolecules*, 42, 612-619 (2009).

Alternatively, the fluorinated methyl ester of Formula (II) can also be prepared from the corresponding fluorinated carboxylic acid of Formula (III).

$$F(CF(CF_3)CF_2O)_nCF(CF_3)-(CO)OH \quad (III)$$

Suitable fluorinated carboxylic acids are commercially available under the trade designation KRYTOX (e.g., KYTOX 157FS(H)). The fluorinated carboxylic acid can be reacted with a chlorinating agent such as thionyl chloride or oxalyl chloride to form the corresponding fluorinated carboxylic acid chloride. The fluorinated carboxylic acid chloride can be subsequently reacted with methanol to form the fluorinated methyl ester of Formula (II).

The fluorinated methyl ester of Formula (II) can then be reduced with sodium borohydride to a fluorinated alcohol of Formula (IV).

$$F(CF(CF_3)CF_2O)_nCF(CF_3)-CH_2OH \quad (IV)$$

The fluorinated alcohol of Formula (IV) can be reacted with allyl bromide to form the fluorinated allyl ether of Formula (V).

$$F(CF(CF_3)CF_2O)_nCF(CF_3)-CH_2OCH_2CH=CH_2 \quad (V)$$

The fluorinated allyl ether of Formula (V) can then be reacted with trichlorosilane to form a fluorinated silane with a trichlorosilyl group. The trichlorosilyl group can be reacted with an alcohol such as methanol to form a trialkoxysilyl group (e.g., a trimethoxysilyl group as in Formula (VI)).

$$F(CF(CF_3)CF_2O)_nCF(CF_3)-CH_2OCH_2CH_2CH_2-Si(OMe)_3 \quad (VI)$$

Methods of preparing the compounds of Formula (IB) are known. These fluorinated silanes can be prepared, for example, as described in U.S. Pat. No. 7,294,731 B1 (Flynn et al.). More specifically, the fluorinated allyl ether of Formula (V) above can be reacted with a mercaptosilane such as, for example, $HSC_3H_6Si(OCH_3)_3$.

The fluorinated silane of Formula (I) is combined with a fluorinated polyether oil in the curable coating composition. Any known fluorinated polyether oil with either zero or one hydrogen atom per molecule can be used. The weight ratio of the fluorinated polyether oil to the fluorinated silane (fluorinated polyether oil:fluorinated silane) is often at least 0.5:100, at least 1:100, at least 2:100, at least 5:100, or at least 10:100. The weight ratio can be up to 75:100, up to 70:100, up to 60:100, up to 50:100, up to 40:100, up to 30:100, or up to 20:100. The weight ratio is often in a range of 1:100 to 75:100, in a range of 5:100 to 70:100, in a range of 5:100 to 60:100, in a range of 5:100 to 50:100, in a range of 5:100 to 40:100, in a range of 5:100 to 30:100, in a range of 10:100 to 50:100, or in a range of 20:100 to 50:100.

Some suitable fluorinated polyether oils are perfluoropolyether oils of Formula (VII).

$$C_3F_7O[CF(CF_3)CF_2O]_bC_2F_5 \quad (VII)$$

In Formula (VII), the variable b is an integer in a range of 10 to 60. For some perfluoropolyether oils of Formula (VII), b is an integer in a range of 10 to 50, 10 to 40, 10 to 30, 20 to 60, 30 to 60, or 40 to 60. The number average molecular weight is usually in a range of 1500 to 10,000 grams/mole. Such perfluoropolyether oils are commercially available under the trade designation KRYTOX (e.g., KRYTOX 1506, 1514, 1525, 16256, and 1645) Vacuum Pump Oil from DuPont (Wilmington, Del., USA) or under the trade designation LEYBOLD (e.g., LEYBOLD HE1600) from Oerlikon Leybold Vacuum (Pfäffikon, Switzerland).

Other suitable fluorinated polyether oils are perfluoropolyether oils of Formula (VIII).

$$F[CF_2CF_2CF_2O]_dCF_2CF_3 \quad (VIII)$$

In Formula (VIII), the variable d is an integer in a range of 10 to 60. For some perfluoropolyether oils of Formula (VIII), d is an integer in a range of 10 to 50, 10 to 40, 10 to 30, 20 to 60, 30 to 60, or 40 to 60. The number average molecular weight is typically in a range of 1500 to 9000 grams/mole. Such perfluoropolyether oils are commercially available under the trade designation DEMNUM (e.g., DEMNUM S-20, S-65, and S-200) from Daikin (Carrollton, Tex., USA).

Still other suitable fluorinated polyether oils are perfluoropolyether oils of Formula (IX).

$$CF_3[OCF(CF_3)CF_2]_m(OCF_2)_kOCF_3 \quad (IX)$$

These oils are random polymers. In Formula (IX), the sum (m+k) is in an integer in a range of 8 to 45 and the quotient (m+k) is in a range of 20 to 1000. For some perfluoropolyether oils of Formula (IX), the sum (m+k) is an integer in a range of 10 to 45, 10 to 40, 10 to 30, 20 to 45, 20 to 40, or 30 to 45. The number average molecular weight is typically in a range of 1500 to 7250 grams/mole. Such perfluoropolyether oils are commercially available under the trade designation FOMBLIN-Y (e.g., FOMBLIN-Y04, Y25, YR, and YR1800) from Solvay Plastics (Brussels, Belgium).

Yet other suitable fluorinated polyether oils are perfluoropolyether oils of Formula (X).

$$CF_3[OCF_2CF_2]_p(OCF_2)_qOCF_3 \quad (X)$$

These oils are random polymers. In Formula (X), the sum (p+q) is an integer in a range of 40 to 180 and the quotient (p+q) is in a range of 0.5 to 2. For some perfluoropolyether oils of Formula (X), the sum (p+q) is in a range of 40 to 160, 40 to 120, 40 to 100, 40 to 80, 40 to 60, 50 to 180, 50 to 120, 50 to 100, 60 to 180, 60 to 120, 60 to 100, 80 to 180, 80 to 120, or 80 to 100. The number average molecular weight is typically in a range of 4,000 to 13,000 grams/mole. Such perfluoropolyether oils are commercially available under the trade designation FOMBLIN-Z (e.g., FOMBLIN-Z03, Z15, Z25, and Z60) from Solvay (Brussels, Belgium).

In some embodiments, the fluorinated polyether oils are of Formula (XI).

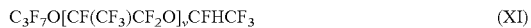

$$C_3F_7O[CF(CF_3)CF_2O]_vCFHCF_3 \quad (XI)$$

This fluorinated polyether oil has one hydrogen atom per molecule. The variable v is an integer in a range of 3 to 60. In some embodiments of Formula (XI), the variable v in an integer in a range of 4 to 60, 5 to 60, 10 to 60, 20 to 60, 40 to 60, 5 to 50, 5 to 40, 5 to 30, or 5 to 20. The number average molecular weight can be in a range of 750 to 10,000 or in a range of 750 to 7000. This material can be prepared as described in EP Patent No. 1,373,014 (Selman et al.) by reaction of a fluorinated carboxylic acid of Formula (III) with a metal hydroxide such as potassium hydroxide in a protic solvent such as ethylene glycol with heating.

In addition to the fluorinated silane of Formula (I) and a fluorinated polyether oil (e.g., a fluorinated polyether oil of Formulas (VII), (VIII), (IX), (X), or (XI)), the curable coating composition can include an optional crosslinker. The crosslinker typically has two or more reactive silyl groups (i.e., a reactive silyl group is one that has at least one hydroxyl or hydrolyzable group). These silyl groups of the crosslinker can react with any reactive silyl group of the fluorinated silane that has not reacted with the siliceous substrate. Alternatively, a first group of the crosslinker can react with the siliceous substrate and a second group of the crosslinker can react with a reactive silyl group of the fluorinated silane. In this alternative reaction, the crosslinker can function as a linker between the fluorinated silane and the siliceous substrate.

Some crosslinkers have multiple reactive silyl groups. Some crosslinkers can be polymers with multiple silyl groups. One such polymer is poly(diethoxysilane). Other crosslinkers can be of Formula (XII) or Formula (XIII).

$$Si(R^3)_{4-y}(R^4)_y \quad (XII)$$

$$R^5-[Si(R^6)_{3-z}(R^7)_z]_2 \quad (XIII)$$

In Formula (XII) or (XIII), each $R^3$ or $R^6$ is independently hydroxyl or a hydrolyzable group and each $R^4$ or $R^7$ is independently a non-hydrolyzable group. The variable y in Formula (XII) is an integer in a range of 0 to 3 (i.e., 0, 1, 2, or 3). The variable z in Formula (XIII) is an integer in a range of 0 to 2 (i.e., 0, 1, or 2). The group $R^5$ in Formula (XIII) is an alkylene having 1 to 10 carbon atoms, 1 to 6 carbon atoms, 1 to 4 carbon atoms, or 1 to 3 carbon atoms. The alkylene $R^5$ can be linear, branched, cyclic, or a combination thereof.

Each $R^3$ or $R^6$ group in Formulas (XII) or (XIII) respectively is a hydroxyl or hydrolyzable group. This group can react with a remaining reactive silyl in a fluorinated silane. Reacting multiple such $R^3$ or $R^6$ groups with multiple fluorinated silanes can result in the crosslinking of the fluorinated silanes. Alternatively, one such group can also react with the surface of a siliceous substrate and another such group can react with a fluorinated silane to covalently attach the fluorinated silane to the siliceous substrate. Suitable hydrolyzable $R^3$ or $R^6$ groups include, for example, alkoxy, aryloxy, aralkyloxy, acyloxy, or halo groups.

Suitable alkoxy $R^3$ or $R^6$ groups are of formula —$OR^a$ where $R^a$ is an alkyl group having 1 to 10 carbon atoms, 1 to 6 carbon atoms, 1 to 4 carbon atoms, 1 to 3 carbon atoms, or 1 to 2 carbon atoms. The alkyl portion of the alkoxy group can be linear, branched, cyclic, or a combination thereof. In many embodiments of Formula (I), each $R^3$ or $R^6$ group is an alkoxy having 1 to 4 carbon atoms or 1 to 3 carbon atoms.

Suitable aryloxy $R^3$ or $R^6$ groups are of formula —OAr where Ar is an aryl group. The aryl group is monovalent group having at least one carbocyclic aromatic ring. Additional carbocyclic rings can be fused to the aromatic ring. Any additional rings can be unsaturated, partially saturated, or saturated. The aryl portion of the aryloxy group often has 6 to 12 carbon atoms or 6 to 10 carbon atoms. In many embodiments, the aryloxy group is phenoxy.

Suitable aralkyloxy $R^3$ or $R^6$ groups are of formula —$OR^b$—Ar. The group $R^b$ is a divalent alkylene group having 1 to 10 carbon atoms, 1 to 6 carbon atoms, or 1 to 4 carbon atoms and an aryl portion with 6 to 12 carbon atoms, or 6 to 10 carbon atoms. The alkylene can be linear, branched, cyclic, or a combination thereof. The group Ar is an aryl group having at least one carbocyclic aromatic ring. Additional carbocyclic rings can be fused to the aromatic ring. Any additional rings can be unsaturated, partially saturated, or saturated. The aryl group often has 6 to 12 carbon atoms or 6 to 10 carbon atoms. The aryl group is often phenyl.

Suitable acyloxy $R^3$ or $R^6$ groups are of formula —O(CO)$R^c$ where $R^c$ is alkyl, aryl, or aralkyl. The group (CO) denotes a carbonyl group. Suitable alkyl $R^c$ groups often have 1 to 10 carbon atoms, 1 to 6 carbon atoms, or 1 to 4 carbon atoms. The alkyl can be linear, branched, cyclic, or a combination thereof. Suitable aryl $R^c$ groups are carbocyclic and have at least one aromatic ring. Additional carbocyclic rings can be fused to the aromatic ring. Any additional rings can be unsaturated, partially saturated, or saturated. The aryl group often has 6 to 12 carbon atoms or 6 to 10 carbon atoms. The aryl group is often phenyl. Suitable aralkyl $R^c$ groups often have an alkylene group having 1 to 10 carbon atoms, 1 to 6 carbon atoms, or 1 to 4 carbon atoms and an aryl group with 6 to 12 carbon atoms, or 6 to 10 carbon atoms. The alkylene portion of the aralkyl group can be linear, branched, cyclic, or a combination thereof. The aryl portion of the aralkyl group has at least one carbocyclic aromatic ring. Additional carbocyclic rings can be fused to the aromatic ring. Any additional rings can be unsaturated, partially saturated, or saturated. The aryl group often has 6 to 12 carbon atoms or 6 to 10 carbon atoms. The aryl portion of the aralkyl group is often phenyl.

Suitable halo $R^3$ or $R^6$ groups can be bromo, iodo, or chloro groups. The halo is often chloro.

Each $R^4$ or $R^7$ group in Formulas (XII) or (XIII) respectively is a non-hydrolyzable group. Many non-hydrolyzable groups are alkyl, aryl, and aralkyl groups. Suitable alkyl $R^4$ or $R^7$ groups include those having 1 to 10 carbon atoms, 1 to 6 carbon atoms, or 1 to 4 carbon atoms. The alkyl can be linear, branched, cyclic, or a combination thereof. Suitable aryl $R^4$ or $R^7$ groups are carbocyclic and have at least one aromatic ring. Additional carbocyclic rings can be fused to the aromatic ring. Any additional rings can be unsaturated, partially saturated, or saturated. The aryl group often has 6 to 12 carbon atoms or 6 to 10 carbon atoms. The aryl group is often phenyl. Suitable aralkyl $R^4$ or $R^7$ groups often have an alkylene group having 1 to 10 carbon atoms, 1 to 6 carbon atoms, or 1 to 4 carbon atoms and an aryl group with 6 to 12 carbon atoms, or 6 to 10 carbon atoms. The alkylene portion of the aralkyl group can be linear, branched, cyclic, or a combination thereof. The aryl portion of the aralkyl group has at least one carbocyclic aromatic ring. Additional carbocyclic rings can be fused to the aromatic ring. Any additional rings can be unsaturated, partially saturated, or saturated. The aryl group often has 6 to 12 carbon atoms or 6 to 10 carbon atoms. The aryl portion of the aralkyl group is often phenyl.

Example crosslinkers include, but are not limited to, tetraalkoxysilanes such as tetraethoxysilane (TEOS) and bis(triethoxysilyl)ethane.

If included in the curable coating composition, the weight ratio of the crosslinker to the fluorinated silane (crosslinker fluorinated silane) is often at least 0.5:100, at least 1:100, at least 2:100, or at least 5:100. The weight ratio can be up to 30:100, up to 20:100, or up to 10:100. For example, the weight ratio of crosslinker to fluorinated silane can be in a range of 0.5:100 to 30:100, in a range of 1:100 to 20:100, or in a range of 1:100 to 10:100.

Any of the curable coating compositions can include an optional solvent that is usually a fluorinated solvent. The fluorinated solvent is typically miscible with the fluorinated silane or with both the fluorinated silane and the fluorinated polyether oil. The fluorinated solvents may include, but are not limited to, perfluorinated hydrocarbons such as, for example, perfluorohexane, perfluoroheptane and perfluorooctane; fluorinated hydrocarbons such as, for example, pentafluorobutane, perfluorohexylethene ($C_6F_{13}CH=CH_2$), perfluorobutylethene ($C_4F_9CH=CH_2$), $C_4F_9CH_2CH_3$, $C_6F_{13}CH_2CH_3$, $C_6F_{13}H$, $C_2F_5CH=CHC_4F_9$, or 2,3-dihydrodecafluoropentane; hydrofluoroethers such as, for example, methyl perfluorobutyl ether, ethyl perfluorobutyl ether, $CF_3CH_2OCF_2CF_2H$, and $C_2F_5CF=CFCF(OC_2H_5)C_2F_5$; and combinations thereof. Some hydrofluoroethers are commercially available from 3M Company (Saint Paul, Minn.) under the trade designation 3M NOVEC ENGINEERED FLUID (e.g., 3M NOVEC ENGINEERED FLUID 7000, 7100, 7200, 7200DL, 7300, 7500, 71DE and 71DA).

The fluorinated solvent may contain small amounts of optional organic solvents which are miscible with the fluorinated solvent. For example, the solvent (i.e., fluorinated solvent plus optional organic solvent) can include up to 10 weight percent, up to 8 weight percent, up to 6 weight percent, up to 4 weight percent, up to 2 weight percent, or up to 1 weight percent organic solvent based on a total weight of solvent. Suitable organic solvents for combining with the fluorinated solvent include, but are not limited to, aliphatic alcohols such as, for example, methanol, ethanol, and isopropanol; ketones such as, for example, acetone and methyl ethyl ketone; esters such as, for example, ethyl acetate and methyl formate; ethers such as, for example, diethyl ether, diisopropyl ether, methyl t-butyl ether, and dipropylene glycol monomethyl ether (DPM); chlorinated hydrocarbons such as trans-dichloroethylene; alkanes such as, for example, heptane, decane, and other paraffinic (i.e., olefinic) organic solvents. Preferred organic solvents often include aliphatic alcohols such as ethanol and isopropanol.

If a solvent (i.e., a fluorinated solvent plus any optional organic solvent) is added to the curable coating composition, any suitable amount of the solvent can be used. Typically, the other components of the curable coating composition such as the fluorinated silane and the fluorinated polyether oil are dissolved in the solvent. The amount of solvent can also be selected to provide the desired viscosity for application of the curable coating composition to a siliceous substrate. Some example curable coating compositions contain up to 50 weight percent, up to 60 weight percent, up to 70 weight percent, up to 75 weight percent, up to 80 weight percent, up to 90 weight percent, up to 95 weight percent, up to 98 weight percent, or up to 99 weight percent solvent. Some example curable coating compositions contain at least 1 weight percent, at least 5 weight percent, at least 10 weight percent, at least 15 weight percent, at least 20 weight percent, at least 25 weight percent, or at least 30 weight percent solvent. For example, the curable coating compositions can include 1 to 98 weight percent, 1 to 95 weight percent, 5 to 90 weight percent, 10 to 90 weight percent, 20 to 90 weight percent, 30 to 90 weight percent, 40 to 90 weight percent, 50 to 90 weight percent, 50 to 85 weight percent, or 60 to 85 weight percent solvent.

In some embodiments, the curable coating composition can be provided in the form of a concentrate that includes 1) a fluorinated silane of Formula (I), 2) a fluorinated polyether oil, and 3) a fluorinated solvent. The concentrate contains up to 99 weight percent, up to 98 weight percent, up to 95 weight percent, up to 90 weight percent, up to 85 weight percent, up to 80 weight percent, up to 75 weight percent, or up to 70 weight percent fluorinated solvent based on a total weight of the concentrate. The weight ratio of the fluorinated polyether oil to the fluorinated silane (fluorinated polyether oil:fluorinated silane) is often in a range of 1:100 to 75:100, in a range of 5:100 to 70:100, in a range of 5:100 to 60:100, in a range of 5:100 to 50:100, in a range of 5:100 to 40:100, in a range of 5:100 to 30:100, in a range of 5:100 to 20:100, or in a range of 10:100 to 20:100.

In some embodiments, an optional moisture curing catalyst is included in the curable coating composition. Suitable moisture curing catalysts arm those that are soluble in the curable coating composition (e.g., in the fluorinated solvent or in the combination of fluorinated solvent plus optional organic solvent) and can include, for example, ammonia, N-heterocyclic compounds, monoalkylamines, dialkylamines, or trialkylamines, organic or inorganic acids, metal carboxylates, metal acetylacetonate complexes, metal powders, peroxides, metal chlorides, organometallic compounds, and the like, and combinations thereof. When used, the moisture curing catalysts are used in amounts that are soluble in the curable coating compositions. In some embodiments, the moisture curing agents are present in an amount in a range of 0.1 to 10 weight percent, in a range of 0.1 to about 5 weight percent, or in a range of 0.1 to about 2 weight percent based on a total weight of the curable coating composition.

Example N-hetrocyclic compounds that can function as moisture curing catalysts include, but are not limited to, 1-methylpiperazine, 1-methylpiperidine, 4,4'-trimethylenedipiperidine, 4,4'-trimethylene-bis(1-methylpiperidine), diazobicyclo[2.2.2]octane, cis-2,6-dimethylpiperazine, and the like, and combinations thereof. Example monoalkylamines, dialkylamines, and trialkylamines that can function as moisture curing catalysts include, but are not limited to, methylamine, dimethylamine, trimethylamine, phenylamine, diphenylamine, triphenylamine, DBU (that is, 1,8-diazabicyclo[5.4.0]-7-undecene), DBN (that is, 1,5-diazabicyclo[4.3.0]-5-nonene), 1,5,9-triazacyclododecane, 1,4,7-triazacyclononane, and the like, and combinations thereof. Example organic or inorganic acids that can function as moisture curing catalysts include, but are not limited to, acetic acid, formic acid, triflic acid, trifluoroacetic acid, perfluorobutyric acid, propionic acid, butyric acid, valeric acid, maleic acid, stearic acid, citric acid, hydrochloric acid, nitric acid, sulfuric acid, phosphoric acid, chloric acid, hypochlorous acid, and the like, and combinations thereof.

In many embodiments, the curable coating compositions are free of other types of polymeric materials. The only polymeric materials present are the fluorinated silane, the fluorinated polyether oil, and any polymeric impurities that may be present in either of these materials as prepared.

In many embodiments, the curable coating compositions are free of inorganic filler materials such as silica particles. The only filler materials that are present are those that may be present as impurities in the fluorinated silane or the fluorinated polyether oil.

In another aspect, an article is provided that contains a) a siliceous substrate and b) a layer of a curable coating composition adjacent to the siliceous substrate. The curable coating compositions are any of those described herein.

Siliceous substrates include those formed of various materials that contain silicon distributed throughout the substrate. Examples of siliceous substrates include, but are not limited to, glass, ceramic materials, glazed ceramic materials, concrete, mortar, grout, and natural or man-made stone. The siliceous substrate can be, for example, part of an electronic display (e.g., an outer surface of an electronic display such as a touch screen), mirror, window, windshield, ceramic tile, shower stall, toilet, sink, or the like. In many embodiments, the siliceous substrate is transparent, which means that it is possible to see through the siliceous substrate with an unaided human eye. The transparent substrate can be clear or colored.

In yet another aspect, a method of making a fluorinated surface is provided. The method includes providing a siliceous substrate and disposing a curable coating composition adjacent to the siliceous substrate. Any curable coating composition described herein can be used. The method further includes reacting the curable coating composition with a surface of the siliceous substrate to form a cured coating composition. The cured coating composition on the siliceous substrate can provide, for example, abrasion resistant surfaces, easy to clean surfaces, surfaces with good tactile response (i.e., a finger can easily slide over the surface), or a combination thereof.

The curable coating composition can be applied to the siliceous substrate using any suitable application method. In some embodiments, the curable coating compositions are applied using a vapor deposition method. In other embodiments, the curable coating compositions are applied using a technique such as spray coating, knife coating, dip coating, spin coating, meniscus coating, or the like. In still other embodiments, the fluorinated silane can be applied to the siliceous substrate in a first step and the fluorinated polyether oil can be applied to the siliceous substrate in a second step. Any of the above described methods can be used for either the first or second step.

Vapor deposition methods can be used alone or in combination with other application methods. In some embodiments, both the fluorinated silane and the fluorinated polyether oil are vapor deposited on the siliceous substrate. These materials can be deposited together or sequentially. If applied sequentially, the fluorinated silane is typically applied prior to the application of the fluorinated polyether oil. In other embodiments, the fluorinated silane is vapor deposited on the siliceous substrate but alternative application methods are used for the fluorinated polyether oil. Alternative applications methods include, but are not limited to, rubbing the fluorinated polyether oil on the substrate that has been treated with the fluorinated silane or applying the fluorinated polyether oil from a solution containing both a fluorinated solvent and the fluorinated polyether oil. The solution can be applied using various coating methods such as spray coating, knife coating, dip coating, spin coating, or meniscus coating as described below.

When vapor deposition is used for deposition of the fluorinated silane, the fluorinated polyether oil, or both, the siliceous substrate is typically placed within a vacuum chamber. After the pressure has been reduced, the fluorinated silane, fluorinated polyether oil, or both are vaporized within the vacuum chamber. The fluorinated silane, fluorinated oil, or both can be placed in a crucible or imbibed in a porous pellet that is heated within the vacuum chamber. The conditions used for vapor deposition depend on the molecular weight of the fluorinated silane, the fluorinated polyether oil, or both. In some embodiments, the pressure during deposition is less than $10^{-2}$ torr, less than $10^{-3}$ torr, less than $10^{-4}$ torr, or less than $10^{-5}$ torr. If a fluorinated solvent is included in the curable coating composition, the fluorinated solvent is typically removed as the pressure within the vacuum chamber is lowered. The coating temperature is selected based on the boiling point of the materials that are deposited. Typically, a coating temperature at or above the boiling point but below the decomposition temperature is selected. Suitable temperatures are often at least 100° C., at least 150° C., at least 200° C., or at least 250° C.

When coating techniques such as spray coating, knife coating, dip coating, spin coating, or meniscus coating are used, the curable coating composition typically includes a fluorinated solvent. The percent solids of the curable coating composition are usually selected to provide a suitable solution viscosity for the particular application method and to dissolve the various components of the curable coating composition such as the fluorinated silane and fluorinated polyether oil. In many application methods, the percent solids are no greater than 50 weight percent, no greater than 40 weight percent, no greater than 30 weight percent, no greater than 25 weight percent, no greater than 20 weight percent, no greater than 15 weight percent, no greater than 10 weight percent, or no greater than 5 weight percent. The percent solids are usually at least 0.5 weight percent, at least 1 weight percent, at least 2 weight percent, or at least 5 weight percent. The solids include the fluorinated silane, the fluorinated polyether oil, and any other materials dissolved or suspended in the fluorinated solvent.

The curable coating composition is usually applied to the siliceous substrate at room temperature (in a range of 15° C. to 30° C. or in a range of 20° C. to 25° C.). Alternatively, the curable coating composition can be applied to the siliceous substrate that has been preheated at an elevated temperature such as, for example, in a range of 40° C. to 300° C., in a range of 50° C. to 200° C., or in a range of 60° C. to 150° C.

In still another aspect, an article is provided that contains a) a siliceous substrate and b) a layer of a cured coating composition adjacent to the siliceous substrate. The cured coating composition includes a reaction product of a curable coating composition with a surface of the siliceous substrate. Any curable coating composition described herein can be used to form the cured coating composition.

As used herein, the term "curing" refers to the reaction of the silyl group of the fluorinated silane with the siliceous substrate. As used herein, the term "cured coating composition" refers to a coating composition that has undergone curing. The curing reaction results in the formation of a —Si—O—Si— group and the covalent attachment of the fluorinated silane to the siliceous substrate. In this siloxane group, one silicon atom is from the silyl group of the fluorinated silane and the other silicone atom is from the siliceous substrate.

Following application using any method, the curable coating composition can be dried to remove solvent and then cured at ambient temperature (for example, in the range of 15° C. to 30° C. or in the range of 20° C. to 25° C.) or at an elevated temperature (for example, in the range of 40° C. to 300° C., in the range of 50° C. to 250° C., in the range of 50° C. to 200° C., in the range of 50° C. to 175° C., in the range of 50° C. to 150° C., in the range of 50° C. to 125° C., or in the range of 50° C. to 100° C.) for a time sufficient for curing to take place. The sample is often held at the curing temperature for at least 10 minutes, at least 20 minutes, at least 30 minutes, at least 40 minutes, at least 1 hour, at least 2 hours, at least 4 hours, or at least 24 hours. The drying and curing steps can occur concurrently or separately by adjustment of the temperature.

Curing often occurs in the presence of some water. Sufficient water is often present to cause hydrolysis of the hydrolyzable groups described above, so that condensation to form —Si—O—Si— groups can occur (and thereby curing can be achieved). The water can be present in the atmosphere (for example, an atmosphere having a relative humidity of about 20 percent to about 70 percent), on the surface of the siliceous substrate, in the curable coating composition, or a combination thereof.

The cured coatings can have any desired thickness. In many embodiments, the thickness corresponds to at least one monolayer. This thickness is often in a range of 10 to 200 Angstroms. For example, the thickness can be in a range 10 to 100, 20 to 100, 40 to 100, 40 to 80, or 50 to 70 Angstroms.

The articles having a cured coating composition often have improved abrasion resistance compared to the uncoated siliceous substrate. The coated siliceous substrate can be abraded with steel wool (e.g., steel wool No. 0000 that is capable of scratching a glass surface) while retaining water repellant and/or oil repellant properties of the cured coating. The coated siliceous substrate typically has a lower coefficient of friction compared to the uncoated siliceous substrate. This lower coefficient of friction may contribute to the improved abrasion resistance of the coated siliceous substrate. Further, the abrasion resistance can be improved compared to cured coatings without the fluorinated polyether oil such as those containing only cured fluorinated silanes.

The articles having a cured coating composition provide a good tactile response. That is, a finger can slide over the surface of the articles easily. This is particularly desirable when the article is used in electronic displays such in touch screens. The articles may have an improved tactile response compared to cured coatings without the fluorinated polyether oil such as those containing only cured fluorinated silanes.

The articles have an easy to clean surface. This easy to clean surface is provided by the use of fluorinated materials in the curable coating composition. The surfaces of the articles with cured coating compositions tend to be hydrophobic. The contact angle for water is often equal to at least 85 degrees, at least 90 degrees, at least 95 degrees, at least 100 degrees, at least 105 degrees, at least 110 degrees, or at least 115 degrees.

Various items are provided that are curable coating compositions, articles that include the curable coating compositions, articles that include a cured coating composition, and method of making the articles with the cured coating composition.

Item 1 is a curable coating composition that includes 1) a fluorinated silane and 2) a fluorinated polyether oil having zero or one hydrogen atom per molecule. The fluorinated silane is of Formula (I).

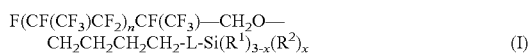
(I)

In Formula (I), L is a single bond or —S—CH$_2$CH$_2$CH$_2$—. Group $R^1$ is hydroxy or a hydrolyzable group. Group $R^2$ is a non-hydrolyzable group. The variable n is an integer in a range of 4 to 100. The variable x is equal to 0, 1, or 2.

Item 2 is the curable coating composition of item 1, wherein the curable coating composition further comprises a fluorinated solvent that is miscible with both the fluorinated silane and the fluorinated polyether oil.

Item 3 is the curable coating composition of item 2, wherein the curable coating composition comprises at least 70 weight percent fluorinated solvent based on a total weight of the curable coating composition.

Item 4 is the curable coating composition of any one of items 1 to 3, wherein a weight ratio of fluorinated polyether oil to fluorinated silane is in a range of 1:100 to 75:100.

Item 5 is the curable coating composition of any one of items 1 to 4, wherein the fluorinated polyether oil is perfluorinated polyether oil.

Item 6 is the curable coating composition of item 5, wherein the perfluorinated polyether oil is of formula $C_3F_7O$[CF(CF$_3$)CF$_2$O]$_b$C$_2$F$_5$ wherein b is an integer in a range of 10 to 60.

Item 7 is the curable coating composition of item 5, wherein the perfluorinated polyether oil is of formula F[CF$_2$CF$_2$CF$_2$O]$_d$CF$_2$CF$_3$ wherein d is an integer in a range of 10 to 60.

Item 8 is the curable coating composition of item 5, wherein the perfluorinated polyether oil is of formula CF$_3$[OCF(CF$_3$)CF$_2$]$_m$(OCF$_2$)$_k$OCF$_3$ where a sum (m+k) is in an integer in a range of 8 to 45 and a quotient (m÷k) is in a range of 20 to 1000.

Item 9 is the curable coating composition of item 5, wherein the perfluorinated polyether oil is random polymer of formula CF$_3$[OCF$_2$CF$_2$]$_p$(OCF$_2$)$_q$OCF$_3$ where a sum (p+q) is an integer in a range of 40 to 180 and a quotient (p÷q) is in a range of 0.5 to 2.

Item 10 is the curable coating composition of any one of items 1 to 4, wherein the fluorinated polyether is of formula C$_3$F$_7$O[CF(CF$_3$)CF$_2$O]$_v$CFHCF$_3$ where v is an integer in a range of 3 to 60.

Item 11 is the curable coating composition of any one of items 1 to 10, wherein the hydrolyzable group if an alkoxy having 1 to 4 carbon atoms.

Item 12 is an article that includes a) a siliceous substrate and b) a layer of a curable coating composition adjacent to the siliceous substrate. The curable coating composition includes 1) a fluorinated silane and 2) a fluorinated polyether oil having zero or one hydrogen atom per molecule. The fluorinated silane is of Formula (I).

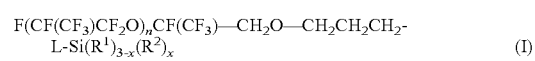
(I)

In Formula (I), L is a single bond or —S—CH$_2$CH$_2$CH$_2$—. Group $R^1$ is hydroxy or a hydrolyzable group. Group $R^2$ is a non-hydrolyzable group. The variable n is an integer in a range of 4 to 100. The variable x is equal to 0, 1, or 2.

Item 13 is the article of item 12, wherein the curable coating composition further comprises a fluorinated solvent that is miscible with both the fluorinated silane and the fluorinated polyether oil.

Item 14 is the article of item 13, wherein the curable coating composition comprises at least 70 weight percent fluorinated solvent based on a total weight of the curable coating composition.

Item 15 is the article of any one of items 12 to 14, wherein a weight ratio of fluorinated polyether oil to fluorinated silane is in a range of 1:100 to 75:100.

Item 16 is the article of any one of items 12 to 15, wherein the fluorinated polyether oil is perfluorinated polyether oil.

Item 17 is the article of item 16, wherein the perfluorinated polyether oil is of formula $C_3F_7O[CF(CF_3)CF_2O]_bC_2F_5$ wherein b is an integer in a range of 10 to 60.

Item 18 is the article of item 16, wherein the perfluorinated polyether oil is of formula $F[CF_2CF_2CF_2O]_dCF_2CF_3$ wherein d is an integer in a range of 10 to 60.

Item 19 is the article of item 16, wherein the perfluorinated polyether oil is of formula $CF_3[OCF(CF_3)CF_2]_m(OCF_2)_kOCF_3$ where a sum (m+k) is in an integer in a range of 8 to 45 and a quotient (m÷k) is in a range of 20 to 1000.

Item 20 is the article of item 16, wherein the perfluorinated polyether oil is random polymer of formula $CF_3[OCF_2CF_2]_p(OCF_2)_qOCF_3$ where a sum (p+q) is an integer in a range of 40 to 180 and a quotient (p÷q) is in a range of 0.5 to 2.

Item 21 is the article of any one of items 12 to 15, wherein the fluorinated polyether is of formula $C_3F_7O[CF(CF_3)CF_2O]_vCFHCF_3$ where v is an integer in a range of 3 to 60.

Item 22 is the article of any one of items 12 to 21, wherein the hydrolyzable group if an alkoxy having 1 to 4 carbon atoms.

Item 23 is an article that contains a) a siliceous substrate and b) a layer of a cured coating composition adjacent to the siliceous substrate. The cured coating composition includes a reaction product of a curable coating composition with a surface of the siliceous substrate. The curable coating composition includes 1) a fluorinated silane and 2) a fluorinated polyether oil having zero or one hydrogen atom per molecule. The fluorinated silane is of Formula (I).

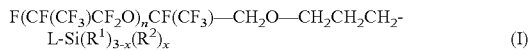

$$F(CF(CF_3)CF_2O)_nCF(CF_3)—CH_2O—CH_2CH_2CH_2-L-Si(R^1)_{3-x}(R^2)_x \quad (I)$$

In Formula (I), L is a single bond or $—S—CH_2CH_2CH_2—$. Group $R^1$ is hydroxy or a hydrolyzable group. Group $R^2$ is a non-hydrolyzable group. The variable n is an integer in a range of 4 to 100. The variable x is equal to 0, 1, or 2.

Item 24 is the article of item 23, wherein the curable coating composition further comprises a fluorinated solvent that is miscible with both the fluorinated silane and the fluorinated polyether oil.

Item 25 is the article of item 24, wherein the curable coating composition comprises at least 70 weight percent fluorinated solvent based on a total weight of the curable coating composition.

Item 26 is the article of any one of items 23 to 25, wherein a weight ratio of fluorinated polyether oil to fluorinated silane is in a range of 1:100 to 75:100.

Item 27 is the article of any one of items 23 to 26, wherein the fluorinated polyether oil is perfluorinated polyether oil.

Item 28 is the article of item 27, wherein the perfluorinated polyether oil is of formula $C_3F_7O[CF(CF)CF_2O]_bC_2F_5$ wherein b is an integer in a range of 10 to 60.

Item 29 is the article of item 27, wherein the perfluorinated polyether oil is of formula $F[CF_2CF_2CF_2O]_dCF_2CF_3$ wherein d is an integer in a range of 10 to 60.

Item 30 is the article of item 27, wherein the perfluorinated polyether oil is of formula $CF_3[OCF(CF_3)CF_2]_m(OCF_2)_kOCF_2$ where a sum (m+k) is in an integer in a range of 8 to 45 and a quotient (m=k) is in a range of 20 to 1000.

Item 31 is the article of item 27, wherein the perfluorinated polyether oil is random polymer of formula $CF_3[OCF_2CF_2]_p(OCF_2)_qOCF_3$ where a sum (p+q) is an integer in a range of 40 to 180 and a quotient (p+q) is in a range of 0.5 to 2.

Item 32 is the article of any one of items 23 to 26, wherein the fluorinated polyether is of formula $C_3F_7O[CF(CF_3)CF_2O]_vCFHCF_3$ where v is an integer in a range of 3 to 60.

Item 33 is the article of any one of items 23 to 32, wherein the hydrolyzable group if an alkoxy having 1 to 4 carbon atoms.

Item 34 is a method of making a fluorinated surface. The method includes providing a siliceous substrate and disposing a curable coating composition adjacent to the siliceous substrate. The curable coating composition includes 1) a fluorinated silane and 2) a fluorinated polyether oil having zero or one hydrogen atom per molecule. The fluorinated silane is of Formula (I).

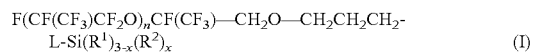

$$F(CF(CF_3)CF_2O)_nCF(CF_3)—CH_2O—CH_2CH_2CH_2-L-Si(R^1)_{3-x}(R^2)_x \quad (I)$$

In Formula (I), L is a single bond or $—S—CH_2CH_2CH_2—$. Group $R^1$ is hydroxy or a hydrolyzable group. Group $R^2$ is a non-hydrolyzable group. The variable n is an integer in a range of 4 to 100. The variable x is equal to 0, 1, or 2. The method further includes reacting the curable coating composition with a surface of the siliceous substrate to form a cured coating composition.

Item 35 is the method of item 34, wherein the curable coating composition further comprises a fluorinated solvent that is miscible with the fluorinated silane and the fluorinated polyether oil.

Item 36 is the method of item 35, wherein the method further comprises removing the fluorinated solvent after disposing the curable coating composition adjacent to the siliceous substrate.

Item 37 is the method of item 34, wherein disposing the curable coating composition adjacent to the siliceous substrate comprises applying the curable coating composition to a surface of the siliceous substrate by spray coating, knife coating, meniscus coating, spin coating, or dip coating.

Item 38 is the method of item 34, wherein disposing the curable coating composition adjacent to the siliceous substrate comprises vapor depositing the fluorinated silane and then applying the fluorinated polyether oil.

Item 39 is the method of item 34, wherein disposing the curable coating composition adjacent to the siliceous substrate comprises vapor depositing the fluorinated silane and the fluorinated polyether oil.

EXAMPLES

Objects and advantages of this invention are further illustrated by the following examples, but the particular materials and amounts thereof recited in these examples, as well as other conditions and details, should not be construed to unduly limit this invention. These examples are for illustrative purposes only and are not meant to be limiting on the scope of the appended claims.

Materials

All solvents were standard reagent grade obtained from commercial sources and were used without further purification unless specified otherwise.

"Glass plate" refers to a float glass pane that was obtained from Cardinal Glass Industries (Eden Prairie, Minn., USA). One side of the glass plate has a tin surface layer.

"HFPO" refers to hexafluoropropylene oxide.

"LEYBOLD HE 1600" refers to the trade designation for LEYBOLD HE 1600 vacuum oil, which is commercially available from Oerlikon Leybold Vacuum (Pfäffikon, Switzerland).

"FC-72" refers to a fully fluorinated liquid that is commercially available from 3M Company (Saint Paul, Minn., USA) under trade designation 3M FLUORINERT ENGINEERED FLUID FC-72.

"NOVEC 7100" refers to a hydrofluoroether solvent that is commercially available from 3M Company (Saint Paul, Minn., USA) under trade designation 3M NOVEC ENGINEERED FLUID 7100.

"NOVEC 7200DL" and "NOVEC 7200" refers to hydrofluoroether solvents that are commercially available from 3M Company (Saint Paul, Minn., USA) under trade designation 3M NOVEC ENGINEERED FLUID 7200DL and 3M NOVEC ENGINEERED FLUID 7200.

"NOVEC 7300" refers to a hydrofluoroether solvent that is commercially available from 3M Company (Saint Paul, Minn., USA) under trade designation 3M NOVEC ENGINEERED FLUID 7300.

"PF-5060" refers to a fully fluorinated liquid that is commercially available from 3M Company (Saint Paul, Minn., USA) under trade designation 3M PERFORMANCE FLUID PF-5060.

"KRYTOX 157FS(H)" refers to a fluorinated synthetic oil based on hexfluoropropylene oxide combined with a carboxylic acid end-group obtained from E. I. du Pont de Nemours and Company, Wilmington, Del. under trade designation DUPONT KRYTOX FUNCTIONAL FLUIDS 157FS(H).

Deposition Method

The side of each glass plate substrate bearing the tin surface layer was identified using fluorescence under UV light and marked as the "back". Coatings according to the examples and comparative examples described below were deposited only on the front or air side of glass plates (substrates).

Prior to use, the glass plate substrates were cleaned by immersion for 10 minutes in a stirred mixture of 4 parts concentrated sulfuric acid and one part 30 percent hydrogen peroxide that was heated to approximately 100° C. Upon removal from the cleaning mixture, the glass plates were placed in a deionized water bath and then rinsed under a stream of deionized water. The glass plates were then dried under a stream of nitrogen and coated within approximately 30 minutes.

The coatings were applied with a spray gun, which is commercially available as part number RG-3L-3S from Anest Iwata (Yokohama, Japan). Enough fluid was applied to completely coat the glass surface. After spray coating, the coated glass plates were cured in an oven heated to at least 135° C. for a time as specified in each example below. After curing, the coated glass plates were allowed to cool and rest for a minimum of 16 hours before any subsequent testing.

Method for Measuring Contact Angle

Coated substrates were prepared as described in the following examples and comparative examples using the deposition method as described above.

The coated substrates were wiped with a woven cloth (commercially available from VWR North America (Batavia, Ill., USA) under the trade designation SPEC-WIPE 4 (catalog number 21912-046) that was moistened with isopropyl alcohol (IPA). The IPA was allowed to evaporate before measuring water ($H_2O$) and hexadecane (HD) contact angles (using water and hexadecane, respectively, as wetting liquids).

Measurements were made using as-received, reagent-grade hexadecane and filtered deionized water on a Kruss video contact angle analyzer that is available as product number DSA 100S from Kruss GmbH (Hamburg, Germany). Reported values are the averages of measurements on at least three drops. Drop volumes were 5 microliters for static water contact angle measurements and 4 microliters for static hexadecane contact angle measurements.

Method for Abrasion Testing

A TABER 5900 linear abrader, which was obtained from Taber Industries of North Tonawanda (NY, USA), was fitted with a 1 centimeter (cm) by 1 centimeter (cm) square tool from Taber Industries. Steel wool (No. 0000 that is capable of scratching the surface of glass) was cut to approximately 20 millimeters by 20 millimeters in size and placed between the square tool and the coated glass substrates to be tested.

The samples were abraded in increments of at least 1,000 cycles at a rate of 60 cycles/minute (1 cycle consisted of a forward wipe followed by a backward wipe) with a force of 10 Newtons (N) and a stroke length of 70 millimeters. After each 1000 cycles (or as specified otherwise) of abrasion, the coated substrates were cleaned with IPA. Both $H_2O$ and HD contact angles measurements made. The same coated substrate was cleaned again with IPA and subjected to another 1000 cycles (or as specified otherwise) of abrasion.

Preparative Example 1

Preparation of HFPO-Derived Methyl Ester

The methyl ester $F(CF(CF_3)CF_2O)_nCF(CF_3)C(O)OCH_3$, wherein the variable a has an average value in a range of 4 to 100, was prepared by metal fluoride-initiated oligomerization of hexafluoropropylene oxide in diglyme solvent according to the method described in U.S. Pat. No. 3,250,808 (Moore et al.), the description of which is incorporated herein by reference. The product was purified by distillation to remove low-boiling components.

Other solvents could also be used in addition to those described in Moore et al. including hexafluoropropene, 1,1,1,3,3-pentafluorobutane and 1,3-bis(trifluoromethyl)benzene as described by S. V. Kostjuk et al. in *Macromolecules*, 42, 612-619 (2009).

Alternatively, the methyl ester could also be prepared as described below in Preparative Example 2 below from the corresponding commercially available carboxylic acid.

Preparative Example 2

Preparation of HFPO-Derived Ether Silane

Preparation of HFPO-Derived Methyl Ester from HFPO-Derived Carboxylic Acid

KRYTOX 157FS(H) (249.9 grams, 0.042 moles, $M_N$=5900, $C_3F_7O[CF(CF_3)CF_2O]_nCF(CF_3)CO_2H$) and dimethyl formamide (5.0 grams, 0.069 moles) were added to a 500 mL, three-necked round bottom flask equipped with an overhead stirrer and a water condenser topped with a nitrogen tee leading to a source of dry nitrogen and a scrubber containing a dilute solution of aqueous potassium carbonate. The mixture was heated to 75° C. and then thionyl chloride (10.1 grams, 0.085 moles, obtained from Aldrich Chemical Company, Milwaukee, Wis.) was added by pipette through the third neck of the flask. (An equivalent amount of oxalyl chloride could be substituted for the thionyl chloride with the reaction run at 65° C.). Gas evolution was observed and the reaction was stirred for an additional 16 hours at 75° C. The product was HFPO-derived carboxylic acid chloride.

At the end of this time, methanol (25 mL) was added to the reaction mixture to convert the HFPO-derived carboxylic acid chloride to the methyl ester. The reaction mixture was stirred for an additional hour at 75° C. After the mixture had cooled, the resulting two phase system was separated. The lower product phase was dissolved in PF-5060DL (200 mL) and washed once with acetone (25 mL). The solution was filtered through a DRYDISK Separation Membrane with a GORE-TEX process filtration media that is available from Horizon Technology, Inc. (Salem, N.H., USA). The solvent was removed by rotary evaporation to afford $C_3F_7O[CF(CF_3)CF_2O]_nCF(CF_2)CO_2CH_3$ with a yield in excess of 98 percent.

Preparation of HFPO-Derived Alcohol from HFPO-Derived Methyl Ester

The HFPO-derived methyl ester $C_3F_7O[CF(CF_3)CF_2O]_nCF(CF)CO_2CH_3$ ($M_N=5900$, 195.5 grams, 0.033 moles), NOVEC 7100 (293 grams) and tetrahydrofuran (60 grams) were placed within a 1 L, three-necked round bottom flask equipped with an overhead stirrer. The solution was cooled in an ice bath to about 3° C. Sodium borohydride (5.16 grams, 0.136 moles), which was obtained from Aldrich Chemical Company (Milwaukee, Wis., USA), was added to the solution. When the temperature had reached 1° C., anhydrous methanol (4.4 grams) was added.

Three more additions of methanol (approximately 4.4 grams each) were subsequently added at about one hour intervals and the reaction mixture then allowed to warm to room temperature over about 16 hours after the addition of the last methanol charge. The reaction mixture was then cooled in an ice bath to about 1° C. and additional methanol (17.5 grams) added. The mixture was stirred for 30 minutes and then allowed to warm to room temperature. NOVEC 7100 (101 grams) and glacial acetic acid (2.1 grams) were then added to give a mixture having a pH in a range of 6 to 9. Additional acetic acid was added until the pH reached about 5 for a total of 33 grams. Deionized water (200 mL) was then added and the contents of the flask transferred to a separatory funnel. The lower phase was removed and washed with 200 mL water. The lower organic phase was separated, dried over magnesium sulfate, and filtered. The solvent was removed by rotary evaporation to obtain 193 grams of the product alcohol $C_3F_7O[CF(CF_3)CF_2O]_nCF(CF_3)CH_2OH$ in high purity.

Preparation of HFPO-Derived Allyl Ether from HFPO-Derived Alcohol

The HFPO-derived alcohol $C_3F_7O[CF(CF_3)CF_2O]_nCF(CF_3)CH_2OH$ ($M_N=5900$, 181 grams, 0.031 moles) and NOVEC 7200 (360 grams) were placed in a 1 L, three-necked round bottom flask equipped with an overhead stirrer. A solution of potassium hydroxide (4.33 grams, 0.066 moles) in deionized water (7 grams) and tetrabutylammonium bromide (2 grams) were added. The reaction mixture was heated to 63° C. for 30 minutes. Allyl bromide (9.3 grams, 0.076 moles) was then added and the reaction mixture held at 63° C. for about 16 hours. The cooled reaction mixture was then transferred to a separatory funnel and the aqueous phase was separated and discarded. The organic phase was washed with 250 mL of approximately 2N aqueous hydrochloric acid and then with 50 mL of saturated aqueous sodium chloride solution. The lower organic phase was then separated, dried over magnesium sulfate and filtered. Silica gel (15 grams) was then added, the solution agitated briefly, and the silica gel removed by filtration. The solvent was removed by rotary evaporation under vacuum (60° C., 1.3 kPa (10 torr)) to obtain 173 grams of the allyl ether product $C_3F_7O[CF(CF_3)CF_2O]_nCF(CF_3)CH_2CH_2CH=CH_2$ in about 94 weight percent purity which still contained some of the starting material alcohol.

The reaction was repeated with the following charges: 173 grams of the HFPO-derived allyl ether product of 94 percent purity (containing 6 percent of the HFPO-derived alcohol starting material) from the reaction above, NOVEC 7200 (347 grams), potassium hydroxide (9.8 grams, 0.149 moles) in deionized water (12.5 grams), tetrabutylammonium bromide (4 grams) and allyl bromide (23.9 grams, 0.195 moles). The reaction was held at 45° C. for 16 hours. The reaction mixture was decanted from a crystalline solid and placed in a separatory funnel. The aqueous layer and a small amount of an upper oily layer removed. The solvent and any excess volatile reagents were removed by rotary evaporation at reduced pressure and the mixture held at 90° C., 10 torr for one hour. The mixture was redissolved in NOVEC 7200 (500 mL) and filtered. Silica gel (25 grams) was added and the mixture stirred for 30 minutes. The silica gel was removed by filtration and the solvent removed by rotary evaporation at 65° C., 1.3 kPa (10 torr) to obtain 173 grams of the HFPO-derived allyl ether product that contained no HFPO-derived alcohol starting material.

Preparation of HFPO-Derived Ether Silane

The HFPO-derived allyl ether $C_3F_7O[CF(CF_3)CF_2O]_nCF(CF_3)CH_2OCH_2CH=CH_2$ ($M_N=5588$, 20.4 grams, 0.0037 moles) and 1,3-bis(trifluoromethyl)benzene (50 mL, obtained from TCI America (Portland Oreg., USA)) were placed into a 100 mL round bottom flask equipped with a thermocouple and condenser topped with a glass tee leading to a source of dry nitrogen and a mineral oil bubbler. The reaction solution was then heated to 60° C. and trichlorosilane (5.6 grams, 0.041 moles) added. Then, platinum(0)-1,3-divinyl-1,1,3,3-tetramethyldisiloxane complex, solution in xylenes (approximately 2 weight percent Pt, obtained from Aldrich Chemical Company (Milwaukee, Wis., USA)) was added to the solution in three increments of about 0.05 grams each over a period of three hours. The solution was held at 60° C. for an additional three hours. The homogeneous solution was then cooled to room temperature and the excess silane removed under vacuum. To the remaining mixture was then added a solution of trimethyl orthoformate (10.0 grams, 0.094 moles, obtained from Alfa Aesar (Ward Hill, Mass., USA)) and methanol (0.5 grams). The mixture was heated to 60° C. for sixteen hours. An additional 10 grams of methanol was added and the mixture heated to 60° C. for 45 minutes. The warm solution was transferred to a separatory funnel and cooled to room temperature. The lower phase was separated and the small amount of solvent remaining in the silane was removed by rotary evaporation at reduced pressure (50° C., 2 kPa (15 torr)) to give 16.8 grams of clear HFPO-derived ether silane $C_3F_7O[CF(CF_3)CF_2O]_nCF(CF_3)CH_2OCH_2CH_2CH_2Si(OMe)_3$.

Preparative Example 3

Preparation of HFPO-Derived Thioether Silane

HFPO-derived thioether silanes were prepared essentially according to the methods described in U.S. Pat. No. 7,294,731 (Flynn et al.), the description of which is incorporated herein by reference. The preparation of the HFPO-derived thioether silane with a number average molecular weight equal to 5900 grams/mole was as follows.

$C_3F_7O[CF(CF_3)CF_2O]_nCF(CF_3)CH_2OCH_2CH=CH_2$, (30 grams, 0.005 mole, $M_n=5700$), $HSC_3H_6Si(OCH_3)_3$ (5.25 grams, 0.027 moles, obtained from Alfa Aesar (Ward Hill, Mass., USA)), ethyl acetate (50 grams), NOVEC 7100 (150 grams) and 2,2'-azobis(2-methylpropionitrile) (0.3 grams, obtained from E. I. Du Pont de Nemours & Co.

(Wilmington, Del., USA) under the trade designation VAZO 64) were combined in a 250 mL round bottom flask equipped with a thermocouple temperature probe, magnetic stir bar and a water filled condenser under a nitrogen atmosphere. The mixture was then sparged with nitrogen for two minutes. The reaction mixture was heated to 63° C. and held at that temperature for 16 hours during which time the reaction became completely homogeneous. The solvent was removed by rotary evaporation and FC-72 (500 grams total) added. This solution was then washed with acetone (50 mL). The lower fluorochemical phase was separated and subsequently the FC-72 was removed by rotary evaporation to give 30.3 grams of the HFPO-derived thioether silane.

Comparative Examples A1-A3

CE A1-A3

All samples described below were coated on cleaned glass substrates, cured and tested according the methods described above (liquid deposition) unless otherwise noted.

For Comparative Example A1, a solution of 2.5 grams of a 20 weight percent solution of HFPO-derived thioether silane (MW 5900) in NOVEC 7200 was diluted to a total weight of 20 grams using NOVEC 7300, was prepared. A cleaned glass plate substrate was spray-coated with the resulting solution.

For Comparative Example A2, a cleaned glass plate substrate was spray-coated with a solution of 2.5 grams of a 20 weight percent solution of HFPO-derived ether silane (MW 2420) in NOVEC 7200 diluted to a total weight of 20 grams with NOVEC 7300.

For Comparative Example A3, a cleaned glass plate substrate was spray-coated with a solution of 2.5 grams of a 20 weight percent solution of HFPO-derived ether silane (MW 5711) in NOVEC 7200 diluted to a total weight of 20 grams with NOVEC 7300.

All samples of Comparative Examples A1-A3 were cured at 135° C. for 10 minutes. After resting, the samples were cleaned and initial contact angle measurements were performed. The samples were then abraded according to the abrasion test method. Contact angle measurements were performed after each 1000 cycles of abrasion testing as described above. The test results are summarized in Table 1 below.

Examples 1A-1C

Ex. 1A-1C

Examples 1A-1C were prepared in the same manner as the Comparative Examples A1-A3, respectively, except that the Examples 1A-1C were treated with a total of 5 drops of LEYBOLD HE1600 oil (commercially available from Oerlikon Leybold Vacuum (Pfäffikon, Switzerland)). The drops were spaced evenly over an unabraded region of the plate and then smoothed over the surface with a woven cloth. The unabraded regions of the samples were then abraded.

Examples 1A-1C were abrasion tested for sets of 5000 cycles each (as opposed to 1000 cycles for Comparative Examples A1-A3). The excess oil was wiped from the coated glass plates using a woven cloth afterwards. The coated glass substrates were further cleaned between each set of abrasions by washing with NOVEC 7200 (5 mL), and wiped dry with a woven cloth. The coated glass substrates were further cleaned between each set of abrasions by washing with isopropanol (5 mL) and wiped dry with a woven cloth. After cleaning, contact angle measurements were performed after each set of abrasions. Before the next set of abrasions, the coated glass substrates were washed with isopropanol (5 mL) and dried with a woven cloth, and 5 drops of LEYBOLD HE 1600 oil were reapplied to the surface and smoothed with a woven cloth as before. The test results are summarized in Table 1.

TABLE 1

| Example | $H_2O$ Contact Angle (Degrees) after Abrasion Cycles | | | | HD Contact Angle (Degrees) after Abrasion Cycles | | | |
|---|---|---|---|---|---|---|---|---|
| | 0 | 1000 | 2000 | 3000 | 0 | 1000 | 2000 | 3000 |
| CE A1 | 117.9 | 92.3 | 72.9 | 0 | 73.4 | 68.2 | 54.1 | 0 |
| CE A2 | 115.4 | 112.5 | 107.5 | 23.6 | 70.7 | 69.3 | 61.9 | 0 |
| CE A3 | 116.2 | 107.0 | 96.7 | 89.7 | 68.8 | 68.9 | 58.2 | 41.8 |

| | $H_2O$ Contact Angle (Degrees) after Abrasion Cycles | | | | HD Contact Angle (Degrees) after Abrasion Cycles | | | |
|---|---|---|---|---|---|---|---|---|
| | 0 | 5000 | 10000 | 15000 | 0 | 5000 | 10000 | 15000 |
| Ex. 1A | 113.9 | 82.6 | 58.8 | 0 | 67.5 | 57.6 | 35.9 | 0 |
| Ex. 1B | 109.1 | 114.4 | 110.2 | 99.5 | 66.6 | 70.8 | 67.1 | 61.4 |
| Ex. 1C | 114.4 | 111.6 | 111.7 | 106.9 | 69.2 | 66.2 | 67.6 | 63.5 |

Comparative Examples B

CE B

And Examples 2-4

Ex. 2-4

All samples of Comparative Example B and Examples 2-4 described below were coated, in duplicate runs, on cleaned glass substrates and were cured at 135° C. for 10 minutes. After aging for 3 days, the samples were cleaned and initial contact angle measurements performed for each pair of samples and the results averaged. The samples were then abraded in 1000 cycle increments. The contact angle measurements were performed on each sample after each 1000 cycles of abrasion testing and the results for duplicate samples were averaged.

For Comparative Example B, two cleaned glass plate substrates were spray-coated with a solution of 1 gram of a 20 weight solution of HFPO-derived ether silane (MW 5711) in NOVEC 7200 and 9 grams NOVEC 7300.

For Example 2, two cleaned glass plate substrates were spray-coated with a solution of 1 gram of a 20 weight percent solution of HFPO-derived ether silane (MW 5711) in NOVEC 7200, 0.1 grams LEYBOLD HE1600 oil, and 8.8 grams NOVEC 7300.

For Example 3, two cleaned glass plate substrates were spray-coated with a solution of 1 gram of a 20 weight percent solution of HFPO-derived ether silane (MW 5711) in NOVEC 7200, 0.2 grams LEYBOLD HE1600 oil, and 8.6 grams NOVEC 7300.

For Example 4, two cleaned glass plate substrates were spray-coated with a solution of 1 gram of a 20 weight percent solution of HFPO ether silane (MW 5711) in NOVEC 7200, 1 gram LEYBOLD HE1600 oil, and 8 grams NOVEC 7300

Table 2 below summarizes the contact angle data obtained for Comparative Example B and Examples 2-4.

TABLE 2

| Example | H₂O Contact Angle (Degrees) after Abrasion Cycles | | | | | | |
|---|---|---|---|---|---|---|---|
| | 0 | 1000 | 2000 | 3000 | 4000 | 5000 | 6000 |
| CE B | 118.4 | 116.0 | 114.9 | 109.3 | 86.9 | 85.4 | 74.6 |
| Ex. 2 | 117.7 | 115.5 | 114.6 | 114.6 | 113.2 | 93.5 | 83.0 |
| Ex. 3 | 117.6 | 115.0 | 113.4 | 114.0 | 102.5 | 111.6 | 97.5 |
| Ex. 4 | 117.2 | 110.9 | 112.9 | 78.95 | 79.25 | 65.1 | 41.3 |

| | HD Contact Angle (Degrees) after Abrasion Cycles | | | | | | |
|---|---|---|---|---|---|---|---|
| | 0 | 1000 | 2000 | 3000 | 4000 | 5000 | 6000 |
| CE B | 74.85 | 72.3 | 71.45 | 66.7 | 42.65 | 41.05 | 39.5 |
| Ex. 2 | 76.2 | 71.15 | 70.85 | 69.2 | 66.6 | 57.5 | 40.35 |
| Ex. 3 | 75.6 | 71.3 | 70.45 | 69.2 | 63.7 | 67.7 | 55.9 |
| Ex. 4 | 71.55 | 67.6 | 68.45 | 48.45 | 41.2 | 36.55 | 15 |

Example 5

Ex. 5

All samples described below were coated on cleaned glass substrates, cured and tested according the methods described above (liquid deposition) unless otherwise noted.

For Example 5, three cleaned glass plate (Examples 5A, 5B and 5C) substrates were spray-coated with a solution of 2.5 grams of a 20 weight percent solution of HFPO-derived ether silane (MW 5711) in NOVEC 7200 diluted to a total weight of 20 grams with NOVEC 7300. The coated glass substrates of Example 5A-5C were then cured at 135° C. for 10 minutes.

After cooling for 30 minutes, the coated glass substrates were further spray-coated with a 2.5 weight percent solution of LEYBOLD HE 1600 oil in NOVEC 7300 to supply a top coat of the lubricious additive. The samples were cured again at 135° C. for 10 minutes. After aging for 3 days, the coated glass samples were cleaned and initial contact angle measurements performed. The samples were then abraded in 1000 cycle increments and contact angle measurements performed after each 1000 cycles of abrasion testing as described above. The results for 5A-5C were averaged and the average results are summarized in Table 3.

TABLE 3

| Example | H₂O Contact Angle (Degrees) after Abrasion Cycles | | | | | |
|---|---|---|---|---|---|---|
| | 0 | 1000 | 2000 | 3000 | 4000 | 5000 |
| Ex. 5 | 116.3 | 113.9 | 107.4 | 106.4 | 89.1 | 96.0 |

| | HD Contact Angle (Degrees) after Abrasion Cycles | | | | | |
|---|---|---|---|---|---|---|
| | 0 | 1000 | 2000 | 3000 | 4000 | 5000 |
| Ex. 5 | 75.3 | 69.9 | 70.2 | 60.4 | 63.7 | 55.8 |

The invention claimed is:

1. A curable coating composition comprising:
1) a fluorinated silane of Formula (I)

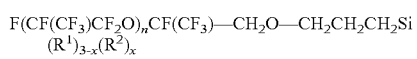

$F(CF(CF_3)CF_2O)_n CF(CF_3)-CH_2O-CH_2CH_2CH_2Si(R^1)_{3-x}(R^2)_x$     (I)

wherein
R¹ is hydroxy or a hydrolyzable group;
R² is a non-hydrolyzable group;
n is an integer in a range of 4 to 100;
x is equal to 0, 1, or 2; and 2) a fluorinated polyether oil having zero or one hydrogen atoms per molecule, wherein the curable coating composition is free of silica particles.

2. The curable coating composition of claim 1 further comprising a fluorinated solvent that is miscible with the fluorinated silane and the fluorinated polyether oil.

3. The curable coating composition of claim 2, wherein the curable coating composition comprises at least 70 weight percent fluorinated solvent based on a total weight of the curable coating composition.

4. The curable coating composition of claim 1, wherein a weight ratio of fluorinated polyether oil to fluorinated silane is in a range of 1:100 to 75:100.

5. The curable coating composition of claim 1, wherein the fluorinated polyether oil is perfluorinated polyether oil.

6. The curable coating composition of claim 5, wherein the perfluorinated polyether oil is of formula $C_3F_7O[CF(CF_3)CF_2O]_b C_2F_5$ wherein b is an integer in a range of 10 to 60.

7. The curable coating composition of claim 5, wherein the perfluorinated polyether oil is of formula $F[CF_2CF_2CF_2O]_d CF_2CF_3$ wherein d is an integer in a range of 10 to 60.

8. The curable coating composition of claim 5, wherein the perfluorinated polyether oil is random polymer of formula $CF_3[OCF_2CF_2]_p(OCF_2)_q OCF_3$ where a sum (p+q) is an integer in a range of 40 to 180 and a quotient (p÷q) is in a range of 0.5 to 2.

9. The curable coating composition of claim 1, wherein the fluorinated polyether oil is of formula $C_3F_7O[CF(CF_3)CF_2O]_v CFHCF_3$ where v is an integer in a range of 3 to 60.

10. The curable coating composition of claim 1, wherein the hydrolyzable group is an alkoxy having 1 to 4 carbon atoms.

11. An article comprising:
a siliceous substrate;
a layer of a curable coating composition adjacent to the siliceous substrate, the curable coating composition comprising
1) a fluorinated silane of Formula (I)

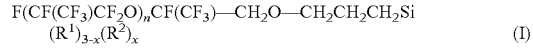

$F(CF(CF_3)CF_2O)_n CF(CF_3)-CH_2O-CH_2CH_2CH_2Si(R^1)_{3-x}(R^2)_x$     (I)

wherein
R¹ is hydroxy or a hydrolyzable group;
R² is a non-hydrolyzable group;
n is an integer in a range of 4 to 100;
x is equal to 0, 1, or 2; and 2) a fluorinated polyether oil having zero or one hydrogen atoms per molecule, wherein the curable coating composition is free of silica particles.

12. An article comprising:
a siliceous substrate; and
a layer of a cured coating composition adjacent to the siliceous substrate, the cured coating composition comprising a reaction product of a curable coating composition with a surface of the siliceous substrate, the curable coating composition comprising
1) a fluorinated silane of Formula (I)

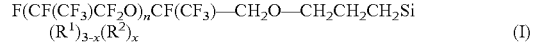

$F(CF(CF_3)CF_2O)_n CF(CF_3)-CH_2O-CH_2CH_2CH_2Si(R^1)_{3-x}(R^2)_x$     (I)

wherein
R¹ is hydroxy or a hydrolyzable group;
R² is a non-hydrolyzable group;
n is an integer in a range of 4 to 100;
x is equal to 0, 1, or 2; and 2) a fluorinated polyether oil having zero or one hydrogen atoms per molecule, wherein the curable coating composition is free of silica particles.

13. A method of making a fluorinated surface, the method comprising:
providing a siliceous substrate;
disposing a curable coating composition adjacent to the siliceous substrate, the curable coating composition comprising
1) a fluorinated silane of Formula (I)

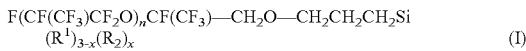

(I)

wherein
$R^1$ is hydroxy or a hydrolyzable group;
$R^2$ is a non-hydrolyzable group;
n is an integer in a range of 4 to 100;
x is equal to 0, 1, or 2; and
2) a fluorinated polyether oil having zero or one hydrogen atoms per molecule, wherein the curable coating composition is free of silica particles; and
reacting the curable coating composition with a surface of the siliceous substrate to form a cured coating composition.

14. The method of claim 13, wherein the curable coating composition further comprises a fluorinated solvent that is miscible with the fluorinated silane and the fluorinated polyether oil.

15. The method of claim 14, wherein the method further comprises removing the fluorinated solvent after disposing the curable coating composition adjacent to the siliceous substrate.

16. The method of claim 13, wherein disposing the curable coating composition adjacent to the siliceous substrate comprises applying the curable coating composition to a surface of the siliceous substrate by spray coating, knife coating, meniscus coating, spin coating, or dip coating.

17. The method of claim 13, wherein disposing the curable coating composition adjacent to the siliceous substrate comprises vapor depositing the fluorinated silane and then applying the fluorinated polyether oil.

18. The method of claim 13, wherein disposing the curable coating composition adjacent to the siliceous substrate comprises vapor depositing the fluorinated silane and the fluorinated polyether oil.

* * * * *

UNITED STATES PATENT AND TRADEMARK OFFICE
CERTIFICATE OF CORRECTION

| | | |
|---|---|---|
| PATENT NO. | : 9,611,399 B2 | Page 1 of 2 |
| APPLICATION NO. | : 14/350776 | |
| DATED | : April 4, 2017 | |
| INVENTOR(S) | : Richard Flynn et al. | |

It is certified that error appears in the above-identified patent and that said Letters Patent is hereby corrected as shown below:

In the Specification

Column 2
Line 11-12 (approx.), delete "$F(CF(CF_3)CF_2O)_nCF(C(CF_3)—CH_2O—CH_2CH_2CH_2-L-Si(R^1)_{3-x}(R^2)_x$" and insert
-- $F(CF(CF_3)CF_2O)_nCF(CF_3)-CH_2O-CH_2CH_2CH_2-L-Si(R^1)_{3-x}(R^2)_x$ --, therefor.

Line 25-26 (approx.), delete "$F(CF(CF_3)CF_2O)_nCF(CF_3)—CH_2O—CH_2CH_2CH_2-L-Si(R^1)_{3-x}(R^2)$" and insert
-- $F(CF(CF_3)CF_2O)_nCF(CF_3)-CH_2O-CH_2CH_2CH_2-L-Si(R^1)_{3-x}(R^2)_x$ --,therefor.

Column 3
Line 28-29 (approx.), delete "$F(CF(CF_3)CF_2O)_nCF(CF_3)—CH_2O—CH_2CH_2CH_2—Si(R^1)_{3-x}(R^2)_x$" and insert
-- $F(CF(CF_3)CF_2O)_nCF(CF_3)-CH_2O-CH_2CH_2CH_2-S-CH_2CH_2CH_2-Si(R^1)_{3-x}(R^2)_x$ --, therefor.

Column 6
Line 47, delete "arc" and insert -- are --, therefor.

Line 49, delete "(m+k)" and insert -- (m÷k) --, therefor.

Line 63, delete "(p+q)" and insert -- (p÷q) --, therefor.

Column 9
Line 8, delete "(crosslinker" and insert -- (crosslinker: --, therefor.

Column 10
Line 27, delete "arm" and insert -- are --, therefor.

Signed and Sealed this
Twenty-ninth Day of August, 2017

Joseph Matal
*Performing the Functions and Duties of the
Under Secretary of Commerce for Intellectual Property and
Director of the United States Patent and Trademark Office*

Line 43, delete "N-hetrocyclic" and insert -- N-heterocyclic --, therefor.

Line 46, delete "(1-methylpiperidine),"" insert -- (1-methylpiperidine), --, therefor.

Column 13
Line 66, delete "F(CF(CF$_3$)CF$_2$)$_n$CF(CF$_3$)—CH$_2$O—CH$_2$CH$_2$CH$_2$CH$_2$-L-Si(R$^1$)$_{3-x}$(R$^2$)$_x$," and insert
-- F(CF(CF$_3$)CF$_2$O)$_n$CF(CF$_3$)-CH$_2$O-CH$_2$CH$_2$CH$_2$-L-Si(R$^1$)$_{3-x}$(R$^2$)$_x$ --, therefor.

Column 15
Line 54-55, delete "C$_3$F$_7$O[CF(CF)CF$_2$O]$_b$C$_2$F$_5$" and insert
-- C$_3$F$_7$O[CF(CF$_3$)CF$_2$O]$_b$C$_2$F$_5$ --, therefor.

Line 60-61, delete "CF$_3$[OCF(CF$_3$)CF$_2$]$_m$(OCF$_2$)$_k$OCF$_2$" and insert
-- CF$_3$[OCF(CF$_3$)CF$_2$]$_m$(OCF$_2$)$_k$OCF$_3$ --, therefor.

Line 62, delete "(m=k)" and insert -- (m÷k) --, therefor.

Line 66, delete "(p+q)" and insert -- (p÷q) --, therefor.

Column 19
Line 8-9, delete "C$_3$F$_7$O[CF(CF$_3$)CF$_2$O]$_n$CF(CF$_2$)CO$_2$C H$_3$" and insert
-- C$_3$F$_7$O[CF(CF$_3$)CF$_2$O]$_n$CF(CF$_3$)CO$_2$CH$_3$ --, therefor.

Line 14-15, delete "C$_3$F$_7$O[CF(CF$_3$)CF$_2$O]$_n$CF(CF)CO$_2$C H$_3$" and insert
-- C$_3$F$_7$O[CF(CF$_3$)CF$_2$O]$_n$CF(CF$_3$)CO$_2$CH$_3$ --, therefor.

Line 65-66, delete "C$_3$F$_7$O[CF(CF$_3$)CF$_2$O]$_n$CF(CF$_3$)CH$_2$CH$_2$CH=CH$_2$" and insert
-- C$_3$F$_7$O[CF(CF$_3$)CF$_2$O]$_n$CF(CF$_3$)CH$_2$OCH$_2$CH=CH$_2$ --, therefor.

In the Claims

Column 24
Line 26, in Claim 8, delete "CF$_3$[OCF$_2$CF$_2$]$_p$(OCF$_2$)OCF$_3$" and insert
-- CF$_3$[OCF$_2$CF$_2$]$_p$(OCF$_2$)$_q$OCF$_3$ --, therefor.

Column 25
Line 11 (approx.), in Claim 13, delete "F(CF(CF$_3$)CF$_2$O)$_n$CF(CF$_3$)—CH$_2$O—CH$_2$CH$_2$CH$_2$Si(R$^1$)$_{3-x}$(R$_2$)$_x$" and insert
-- F(CF(CF$_3$)CF$_2$O)$_n$CF(CF$_3$)-CH$_2$O-CH$_2$CH$_2$CH$_2$Si(R$^1$)$_{3-x}$(R$^2$)$_x$ --, therefor.